United States Patent
Komiya et al.

(10) Patent No.: US 6,940,214 B1
(45) Date of Patent: Sep. 6, 2005

(54) ELECTROLUMINESCENCE DISPLAY DEVICE

(75) Inventors: Naoaki Komiya, Ohgaki (JP); Masahiro Okuyama, Inazawa (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/501,024

(22) Filed: Feb. 9, 2000

(30) Foreign Application Priority Data

Feb. 9, 1999 (JP) ............................................. 11-031385

(51) Int. Cl.⁷ .............................. H01J 5/48; H01J 5/50; H01J 1/62
(52) U.S. Cl. ........................................ 313/51; 313/505
(58) Field of Search ................................ 349/139, 149, 349/151–152, 69–70; 313/51, 505–506

(56) References Cited

U.S. PATENT DOCUMENTS

| | | | |
|---|---|---|---|
| 5,247,190 A | 9/1993 | Friend et al. | 257/40 |
| 5,684,365 A * | 11/1997 | Tang et al. | 345/76 |
| 5,990,629 A * | 11/1999 | Yamada et al. | 349/42 |
| 6,072,450 A * | 6/2000 | Yamada et al. | 345/76 |
| 6,147,451 A * | 11/2000 | Shibata et al. | 313/506 |
| 6,433,486 B1 * | 8/2002 | Yokoyama | 313/506 |
| 6,618,029 B1 | 9/2003 | Ozawa | 313/505 |

FOREIGN PATENT DOCUMENTS

| | | |
|---|---|---|
| EP | 0 895 219 | 2/1999 |
| EP | 0 940 796 | 9/1999 |
| JP | 10-92576 | 4/1998 |
| JP | 10-222136 | 8/1998 |
| JP | 10-254383 | 9/1998 |
| JP | 11-24606 | 1/1999 |

OTHER PUBLICATIONS

European Search Report for Application No. 00301006.3–1235–; dated Feb. 16, 2004.

* cited by examiner

*Primary Examiner*—Dung T. Nguyen
(74) *Attorney, Agent, or Firm*—Cantor Colburn LLP

(57) ABSTRACT

An insulator substrate (110) is provided with a display pixel region (200) comprising an electroluminescence element (160) having a cathode (167), emissive layer (166), and anode (161), and with first and second TFTs for driving the element. Surrounding the display pixel region (200), a peripheral drive circuit region (251) having a third TFT for driving each pixel is further provided on the insulator substrate (110). The cathode (167) is disposed in a region other than the peripheral drive circuit region (251). With this arrangement, generation of a back channel by applying the EL element potential to the cathode is prevented in a complementary TFT employed in the peripheral drive circuit region for controlling the display region, thereby suppressing changes in threshold values due to such back channel generation. As a result, an EL display device with reduced generation of penetration current and minimized increased current consumption is achieved.

23 Claims, 9 Drawing Sheets

ELECTROLUMINESCENCE DISPLAY DEVICE

BACKGROUND OF THE INVENTION

1. Field of the Invention

The present invention relates to an electroluminescence display device employing an electroluminescence element and a thin film transistor.

2. Description of the Related Art

In recent years, electroluminescence (EL) display devices comprising EL elements have gained attention as potential replacement for CRT and LCD devices. Some research has been directed to the development of EL display devices using, for example, thin film transistors (referred to hereinafter as "TFT") as switching elements to drive the EL elements.

FIG. 1 shows a plan view of a related organic EL display device.

As shown in the Figure, the organic EL display device comprises a display pixel region 200 having first and second TFTs for driving an organic EL element of the display pixel. The organic EL display device further comprises a peripheral drive circuit region 250 indicated by a single-dot broken line. The peripheral drive circuit region 250 includes vertical drive circuits 10 and horizontal drive circuit 20 for driving the TFT of the display pixel region.

FIG. 2 shows an equivalent circuit of a related single display pixel using an organic EL element. In the display pixel region 200, a single display pixel is surrounded by a gate signal line 151 and a drain signal line 152. A first TFT 130 is a switching element disposed near a junction of those lines. Source 131s of TFT 130 is connected to gate 142 of a second TFT 140 for driving the organic EL element 160. A storage capacitor 170 is provided between source 131s and gate 142 for retaining for a predetermined period a voltage applied to gate 142. Source 141s of the second TFT 140 is connected to the anode 161 of the organic EL element 160. Drain 141d of TFT 140 is connected to the drive power line 153 that supplies a drive current to the organic EL element 160.

FIG. 3 shows a cross-sectional structure including the second TFT 140 and the organic EL element 160 among components of a single display pixel. Gate electrodes 142 made of refractory metal such as chromium (Cr) or molybdenum (Mo) are formed on an insulator substrate 110 made of quartz glass, non-alkali glass, or a similar material. Sequentially formed over the gate electrodes 142 are a gate insulating film 112 and an active layer 141 using poly-silicon (referred to hereinafter as "p-Si") film. The active layer 141 comprises intrinsic or substantially intrinsic channels 141c formed above the gate electrodes 142, and the source 141s and drain 141d formed on respective sides of these channels 141c by ion doping.

An interlayer insulating film 115 formed by a sequential deposit of a $SiO_2$ film, a SiN film, and a $SiO_2$ film covers the gate insulating film 112 and the active layer 141. A contact hole formed in the interlayer insulating film 115 in a region corresponding to the drain 141d is filled with metal such as aluminum (Al), forming the drive power line 153 connecting to a drive power supply 150. Further, a planarizing insulating film 117 made of an organic resin is formed over the entire substrate to planarize the surface. In a region corresponding to the source 141s, a contact hole is formed penetrating through both the planarizing insulating film 117 and the interlayer insulating film 115. A transparent electrode that contacts the source 141s through this contact hole is formed on the planarizing insulating film 117. The transparent electrode is made of ITO (indium tin oxide), and functions as the anode 161 of the organic EL element 160.

The organic EL element 160 is configured by sequentially forming, in order, the anode 161 made of ITO or similar material connected to the source 141s of the above-mentioned second TFT 140, an element emissive layer 166 composed using an organic compound, and a cathode 167 composed using an alloy of magnesium and indium. In such an organic EL element 160, a hole injected from the anode and an electron injected from the cathode recombines in an emissive layer within the element emissive layer 166. As a result, organic compound molecules in the emissive layer are excited, generating excitons. Through a process of these excitons undergoing radiation until deactivation, light is emitted from the emissive layer. This light radiates outward through the transparent anode 161 and the transparent insulator substrate 110.

As shown in FIG. 3, the anode 161 is discretely formed for each display pixel, and the element emissive layer 166 is formed slightly larger than the anode 161 so as to cover the entire anode 161. The cathode 167 can be formed as one common electrode over the entire substrate because the operation of the cathode can be electrically in common for all pixels. More specifically, as the cathode can be configured as a common electrode, according to the related art the cathode 167 can easily be provided by forming it in the region surrounded by a double-dot broken line in FIG. 1, this being the entire region of the substrate 110.

A TFT using poly-silicon as the active layer can be employed not only as a pixel TFT within the display pixel region 200, but also as a TFT for peripheral drive circuit to drive the display pixel region 200 on the substrate 110. In other words, circuit for driving the display pixel region 200 may be formed on the same substrate 110 as the pixel region. FIG. 4 illustrates a peripheral drive circuit disposed in a surrounding region of the display pixel region 200 as shown in FIG. 1, which is configured using the third TFT. The peripheral drive circuit is described below referring to FIGS. 1 and 4. Peripheral drive circuits configured using the third TFT comprise vertical drive circuits 10 and a horizontal drive circuit 20. A vertical drive circuit 10 includes a vertical shift register (V-SR) 11 and a buffer circuit 12, while a horizontal drive circuit 20 includes a horizontal shift register (H-SR) 21, a buffer 22, and a source line switch 23.

FIG. 4 is a plan view showing the TFT of the buffer constituting the horizontal drive circuit. FIG. 5 shows a cross-sectional view taken along line A—A of FIG. 4.

As shown in FIG. 4, the buffer comprises inverters 400 and 500.

The configuration of the respective TFT of the buffer is next described according to FIG. 5.

Sequentially formed on an insulator substrate 510 composed of a material such as silica glass or non-alkali glass are gate electrodes 511 made of refractory metal such as chromium (Cr) or molybdenum (Mo), a gate insulating film 512, and an active layer 513 composed of poly-silicon film.

The active layer 513 comprises channels 515,516 positioned above the gate electrodes 511. Further within the active layer, sources 518,521 and drains 519,520 are formed on respective sides of these channels 515,516 by performing ion dope using stoppers 517 located above the channels 515,516 as masks. In this example, the TFT drawn towards the right of the figure is a n-type channel TFT having impurity ions such as phosphorus (P) implanted in source 518 and drain 519, while the TFT on the left is a p-type channel TFT having impurity ions such as boron (B) implanted in source 521 and drain 520.

An interlayer insulating film 522 formed by sequentially depositing a $SiO_2$ film, a SiN film, and a $SiO_2$ film is provided on the entire surface over the gate insulating film 512, the active layer 513, and the stoppers 517. Contact holes formed in the interlayer insulating film 522 in regions corresponding to the sources 518,521 and the drains 519,520 are filled with metal such as Al, forming source electrodes 523,525 and a drain electrode 524. The drain electrode 524 connected to the drains 519,520 is provided in common for the n-type channel TFT and the p-type channel TFT. A planarizing insulating film 526 made of an organic resin is formed over the entire surface for planarization.

Above this, the magnesium-indium alloy cathode 167 of the organic EL display element 161 illustrated in FIG. 3 is formed over the entire surface.

The inverter 500 composed on an n-type channel TFT and a p-type channel TFT is configured as described above. The other inverter 400 has a similar structure.

In the manner described above, an organic EL display device comprising a horizontal drive circuit with inverters 400,500, a vertical drive circuit, and a display pixel can be created.

However, when the cathode 167 of the organic EL element 161 is provided on the entire surface over the peripheral drive circuit region and the display pixel region of the organic EL display device as described above, a back channel is created in each TFT because of the cathode 167. The existence of a back channel unduly influences the device, especially in the TFT of the peripheral drive circuit having a C-MOS structure. This is explained below.

FIG. 7 shows Vg-Id characteristics of n-type and p-type channel TFT. In the figure, the dotted lines indicate the initial characteristics, while the solid lines indicate characteristics after power is switched on.

As shown in the FIG. 7, there is at first no current leakage in either the n-type or p-type channel TFT when the gate voltage Vg is 0 V. However, when power is turned on, the potential applied to the cathode causes the characteristic of p-type channel TFT to shift to the right and the characteristic of n-type channel TFT to shift to the left. As a result, current leaks in both TFTs when Vg=0 V.

In a peripheral drive circuit, the TFT has a complementary structure composed with a p-type channel and an n-type channel. Accordingly, a change in the threshold voltage of the p-type channel TFT is caused when a high voltage is applied, while a change in the threshold voltage of n-type channel TFT is caused when the signal voltage is low. As a result, current flow, namely, a penetration current, is generated even when the gate voltage Vg=0. Generation of penetration current due to such changes disadvantageously causes an increase in power consumption.

SUMMARY OF THE INVENTION

The present invention was created in light of the above disadvantages. The purpose of the present invention is to stabilize operational threshold values of a thin film transistor for driving an emissive element such as an organic EL element so as to prevent characteristic changes in a peripheral drive circuit.

The present invention provides an electroluminescence display device comprising a display pixel region disposed on a substrate and having an electroluminescence element including an emissive layer between first and second electrodes and a drive circuit region disposed on the same substrate and having thin film transistors for driving said electroluminescence element wherein said first electrode entirely overlaps said display pixel region, but is absent in at least said drive circuit region.

In another aspect of the present invention, an emissive display device comprises a display pixel region disposed on a substrate and having an emissive element including an emissive layer between first and second electrodes and a drive circuit region disposed on the same substrate surrounding said display pixel region, said drive circuit region having thin film transistors for driving said emissive element, wherein said first electrode overlaps the entire display pixel region, but is absent from at least said drive circuit region.

According to a further aspect of the present invention, said first electrode is formed as a common electrode in said display pixel region.

In a still further aspect of the present invention, said display pixel region includes first and second thin film transistors for driving said electroluminescence element, an insulating film is formed overlapping said first and second thin film transistors and said thin film transistors of said drive circuit region, and said first electrode is formed over said insulating film in a position opposing said display pixel region.

According to another aspect of the present invention, said first electrode is a common cathode and said second electrode is a discrete anode.

In yet another of the present invention, an electroluminescence display device comprises a display pixel region disposed on a substrate, said display pixel region having an electroluminescence element including an emissive layer between an anode and a cathode, and further having first and second thin film transistors for driving said electroluminescence element, and a peripheral drive circuit region disposed surrounding said display pixel region and having third thin film transistors for driving said first and second thin film transistors, wherein said cathode is disposed in said display pixel region, but is absent from said drive circuit region.

According to another aspect of the present invention, said cathode on said substrate is formed over the entire display pixel region as a common electrode, but is absent at least from said peripheral drive circuit region.

According to the present invention, when a first electrode or cathode of an emissive element such as an electroluminescence element is formed as a common electrode in a display pixel region, the first electrode or cathode overlaps the display pixel region but is absent in the drive circuit region, as described above. Characteristic changes are easily caused in a drive circuit using a thin film transistor, and such changes tend to significantly influence power consumption and display quality of the device. By disallowing an electrode of the emissive element to overlap the drive circuit region according to the present invention, influences of the electrode of the emissive element on the drive circuit can be eliminated. Accordingly, the operational threshold values of the thin film transistor in the drive circuit can be stabilized, suppressing any increase in the devices power consumption and thereby achieving a high-performance device with low power consumption.

According to a further aspect of the present invention, a circuit in said drive circuit region includes a CMOS connection structure in which a p-type channel thin film transistor and an n-type channel thin film transistor are complementarily connected.

A circuit having a CMOS structure is favorable as a drive circuit. However, due to the presence of both p-type and n-type transistors, changes in the threshold voltage are likely to be caused in at least one of the types of the transistors during application of either high or low voltage to a gate of a CMOS transistor. Avoiding overlap of the drive circuit and an electrode of the emissive element can suppress characteristic changes of thin film transistors for a reliable drive circuit.

In a still further aspect of the present invention, said thin film transistors of said drive circuit region are bottom gate type transistors having gate electrodes located beneath an active layer, and said first electrode or said cathode is formed over an insulating layer extending on the entire substrate on the side of said active layer opposite from that which said gate electrodes are located, so as to overlap said display pixel region.

When an electrode such as the electrode of an emissive element of the present invention is located in an overlying layer of such a bottom gate type transistor, back channel tends to be generated in a position where the electrode of the element and the active layer of the transistor overlap. Avoiding overlap of the drive circuit having such a transistor and the electrode of the emissive element can suppress characteristic changes of thin film transistors for a reliable drive circuit.

In a further different aspect of the present invention, said emissive layer is a layer using an organic compound as an emissive material.

Forming the emissive layer using an organic compound can be extremely advantageous in a color display device because organic compounds can provide many variations in emitted colors and can be formed from a wide selection of possible materials.

DESCRIPTION OF THE PREFERRED EMBODIMENT

An EL display device of the present invention will now be described.

Figure 7:
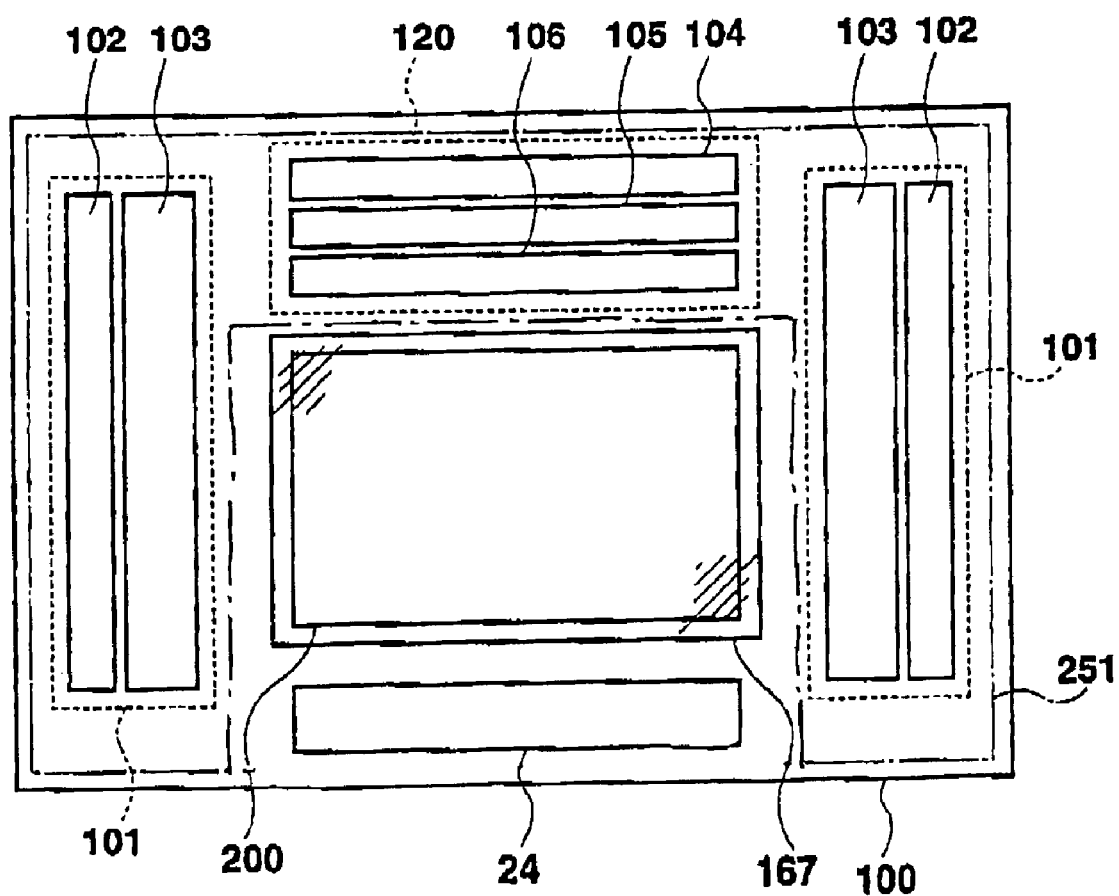
FIG. 7 is a plan view illustrating an EL display device according to the present invention.

FIG. 7 shows a plan view of an organic EL display device. An example in which the EL display device of the present invention is implemented in an organic EL display device is explained referring to this figure.

In the organic EL display device, as shown in FIG. 7, an insulator substrate 100 is provided with a peripheral drive circuit 251 including horizontal drive circuit 120 and vertical drive circuits 101 configured using third TFTs. Also formed on the insulator substrate 100 is a display pixel region 200 including display pixels of the organic EL display. The third TFTs are formed within the peripheral drive circuit region. Each vertical drive circuit 101 includes a vertical shift register (V-SR) 102 and a buffer circuit 103. A horizontal drive circuit 120 includes a horizontal shift register (H-SR) 104, a buffer 105, and a source line switch 106.

Figure 1:
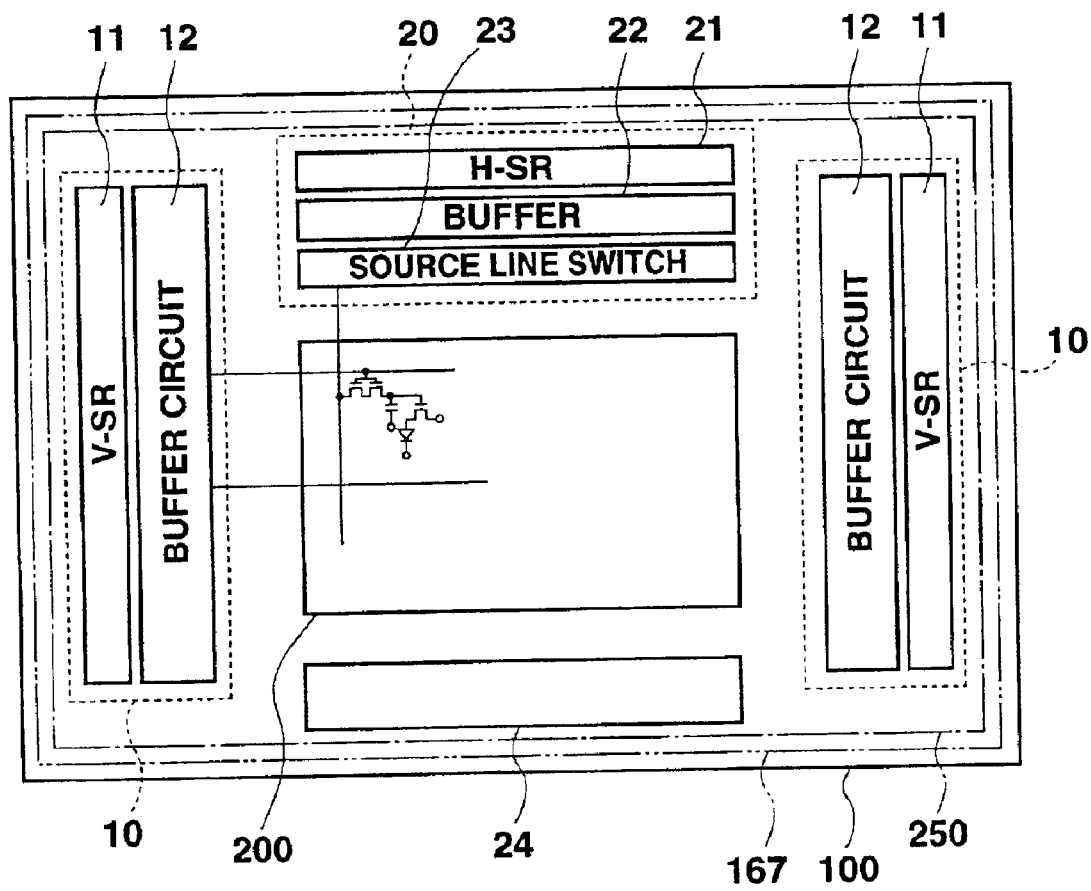
FIG. 1 is a plan view illustrating an EL display device of a related art.
Figure 2:
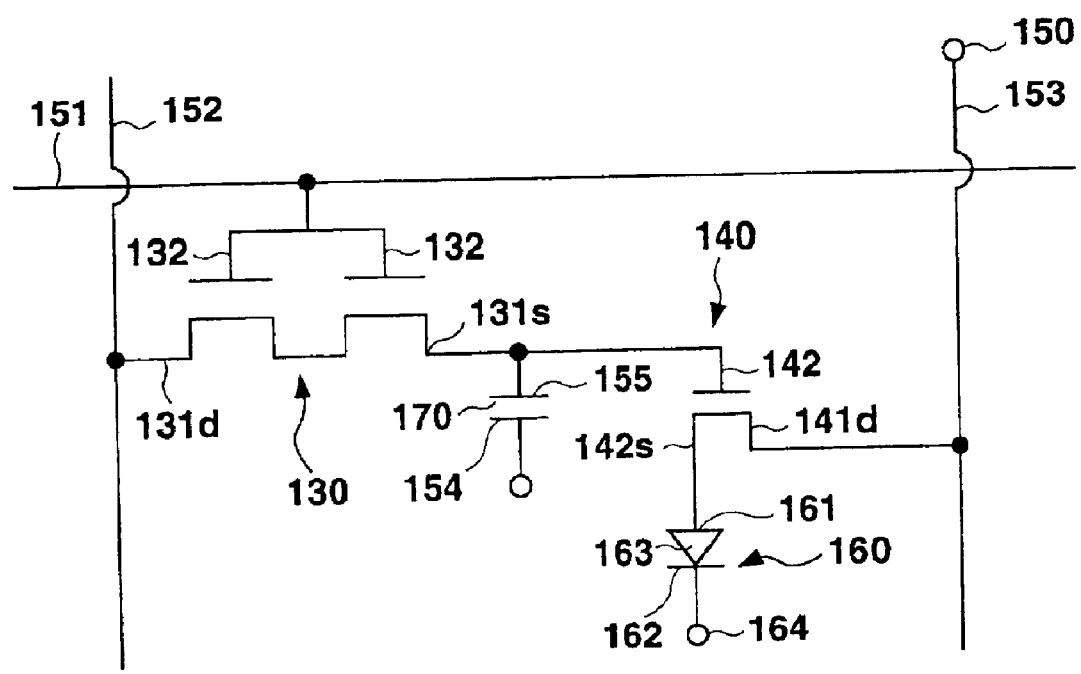
FIG. 2 is a diagram showing an equivalent circuit in a display pixel of an EL display device of a related art.
Figure 3:
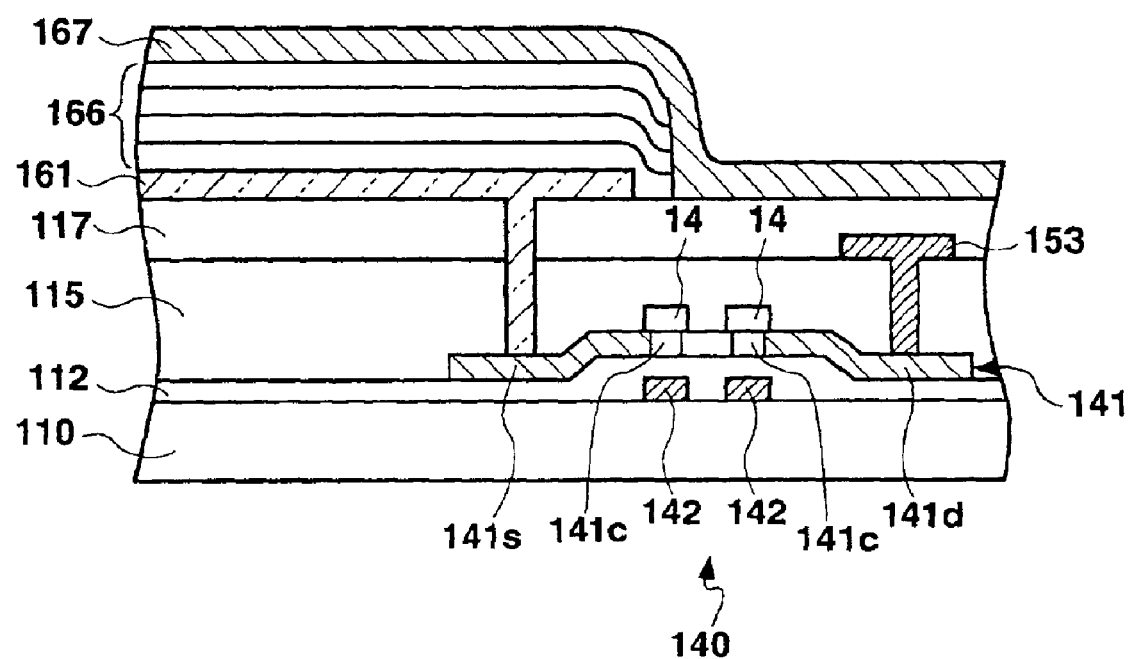
FIG. 3 shows a cross-sectional view of an EL element and a transistor for supplying electric power to this element in an EL display device of a related art.
Figure 8:
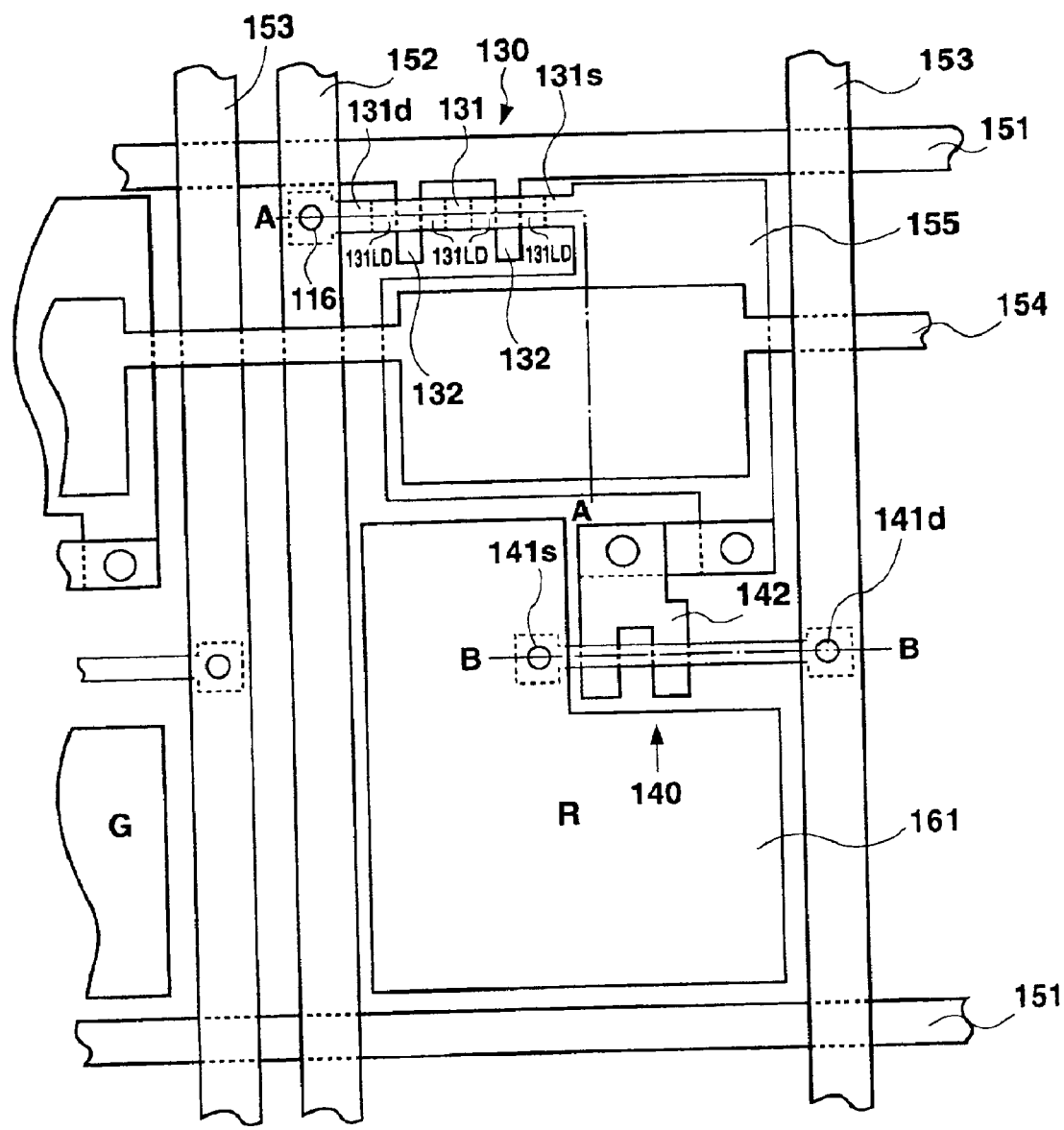
FIG. 8 is a plan view showing one pixel in the display pixel region of FIG. 7.
Figure 9A:
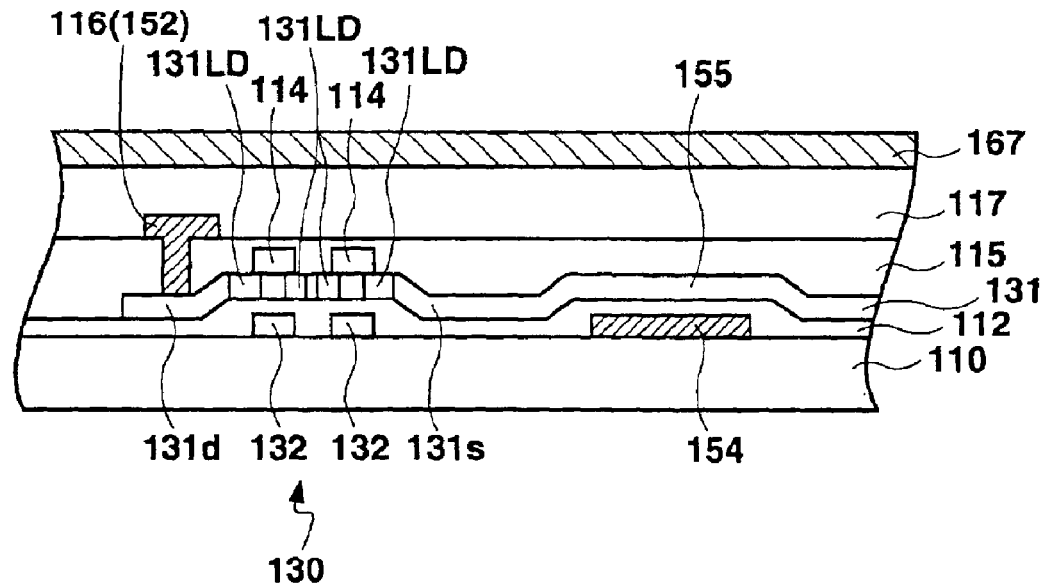
FIG. 9A shows a cross-sectional view taken along line A—A of FIG. 8.
Figure 9B:
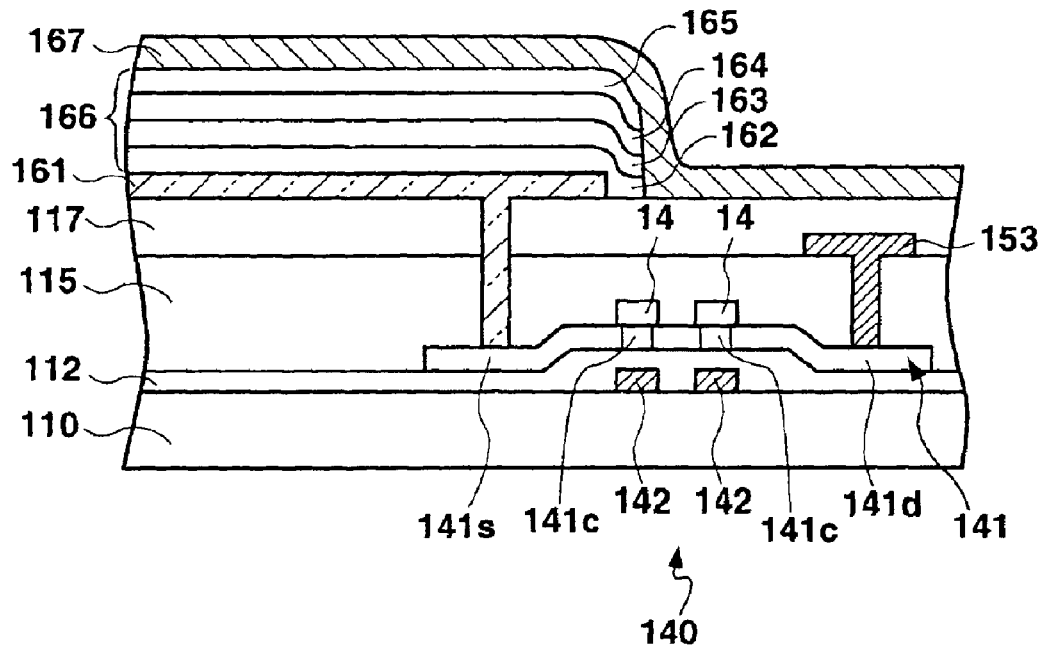
FIG. 9B shows a cross-sectional view taken along line B—B of FIG. 8.

A pixel in the display pixel region 200 has a circuit configuration similar to the above-described FIG. 2 and a plan configuration shown in the example in FIG. 8. FIG. 9A shows a cross-sectional view taken along line A—A of FIG. 8. FIG. 9B shows a cross-sectional view taken along line B—B of FIG. 8.

Each pixel comprises a gate signal line 151, a drain signal line 152, a first TFT 130 formed near the junction of these signal lines 151,152, a storage capacitor 170, a second TFT 140, and an organic EL element 160. The pixels are formed in a matrix arrangement within region 200 on the substrate 110.

Source 131s of the first TFT 130 simultaneously serves as a capacitor electrode 155 that, together with the opposing storage capacitor electrode 154, forms a capacitor. Gate electrode 142 of the second TFT 140 that drives the organic EL element 160 is connected to source 141s of the second TFT 140, and the source 141s contacts with the anode 161 of the organic EL element 160. The drain 141d of the second TFT 140 is connected to a drive power line 153, while the drive power line 153 is connected to a drive power supply 150 that supplies current to the organic EL element 160.

Near the TFT, a storage capacitor electrode 154 is disposed in parallel with the gate signal line 151. The storage capacitor electrode 154 is made of a material such as chromium. A capacitor for storing charges is formed between the storage capacitor electrode 154 and the capacitor electrode 155 connected to source 131s of the first TFT 130 via a gate insulating film 112. This storage capacitor 170 is provided for retaining voltage applied to the gate 142 of the second TFT 140.

The first TFT 130, or the switching TFT, will next be described. As shown in FIG. 9A, a gate signal line 151 made of refractory metal such as chromium (Cr) or molybdenum (Mo), which also serves as gate electrodes 132, is formed on an insulator substrate 110 made of quartz glass, non-alkali glass, or a similar material.

Above these layers, a gate insulating film 112 and an active layer 131 composed of poly-silicon film are sequentially formed. The active layer 131 comprises the so-called LDD (Lightly Doped Drain) structure. Specifically, low-concentration regions 131LD are formed on both sides of each gate 132. The source 131s and the drain 131d, which are high-concentration regions, are further disposed on the outboard sides of the low-concentration regions 131LD.

An interlayer insulating film 115 formed by a sequential lamination of a $SiO_2$ film, a SiN film, and a $SiO_2$ film is provided on the entire surface over the gate insulating film 112 and the active layer 131. A contact hole formed in a position corresponding to the drain 141d is filled with metal such as Al, forming a drain electrode 116 constituting one continuous component with a drain signal line 152. Further, a planarizing insulating film 117 made of an organic resin or a similar material is formed over the entire surface for planarization.

The second TFT 140, or the TFT for driving the organic EL element, will next be described.

As shown in FIG. 9B, gate electrodes 142 composed of refractory metal such as Cr or Mo are formed on an insulator substrate 110 made of silica glass, non-alkali glass, or a similar material. On top of these, a gate insulating film 112 and an active layer 141 composed of poly-silicon film are sequentially formed. The active layer 141 comprises intrinsic or substantially intrinsic channels 141c formed above the gate electrodes 142, and the source 141s and drain 141d formed on respective sides of these channels 141c by ion doping.

An interlayer insulating film 115 formed by a sequential lamination of a $SiO_2$ film, a SiN film, and a $SiO_2$ film is provided on the entire surface over the gate insulating film 112 and the active layer 141. A contact hole formed in a position corresponding to the drain 141d is filled with metal such as Al, thereby forming the drive power line 153 connecting to a drive power supply 150. Further, a planarizing insulating film 117 made of an organic resin or a similar material is formed over the entire surface for planarization. A contact hole is formed in the planarizing insulating film 117 in a position corresponding to the source 141s. A transparent electrode made of ITO that contacts the source 141s through this contact hole, namely, the anode 161 of the organic EL element, is formed on the planarizing insulating film 117.

The organic EL element 160 is formed by first laminating the anode 161 constituted by a transparent electrode made of ITO or similar material. The emissive element layer 166 is then superimposed. The emissive element layer 166 comprises a first hole-transport layer 162 composed of a material such as MTDATA (4,4',4''-tris(3-methylphenylphenylamino)triphenylamine), a second hole-transport layer 163 composed of a material such as TPD (N,N'-diphenyl-N,N'-di(3-mthylphenyl)-1,1'-biphenyl-4,4'-diamine), an emissive layer 164 composed of, for example, $Bebq_2$ (bis(10-hydroxybenzo[h]quinolinato)beryllium) including quinacridone derivatives, and an electron transport layer 165 composed of $Bebq_2$ or similar material. Subsequently, the cathode 167 is formed which may be composed of a magnesium-indium alloy. The above-mentioned layers of the organic EL element 160 are laminated in the described order.

In the present embodiment, the cathode 167 extends covering the entire display pixel region 200 as shown in FIG. 7, but does not reach the drive circuit region 251 disposed surrounding region 200. The cathode 167 is formed in a contour corresponding to or slightly larger than the display pixel region 200.

The structure of the peripheral drive circuit region 251 indicated by a single-dot broken line and located outside the display pixel region 200 in FIG. 7 will now be explained. As described above, region 251 includes a horizontal drive circuit 120, vertical drive circuits 101, and an input wiring terminal 24 for supplying electric power (voltage, current) from an external power supply.

Figure 4:
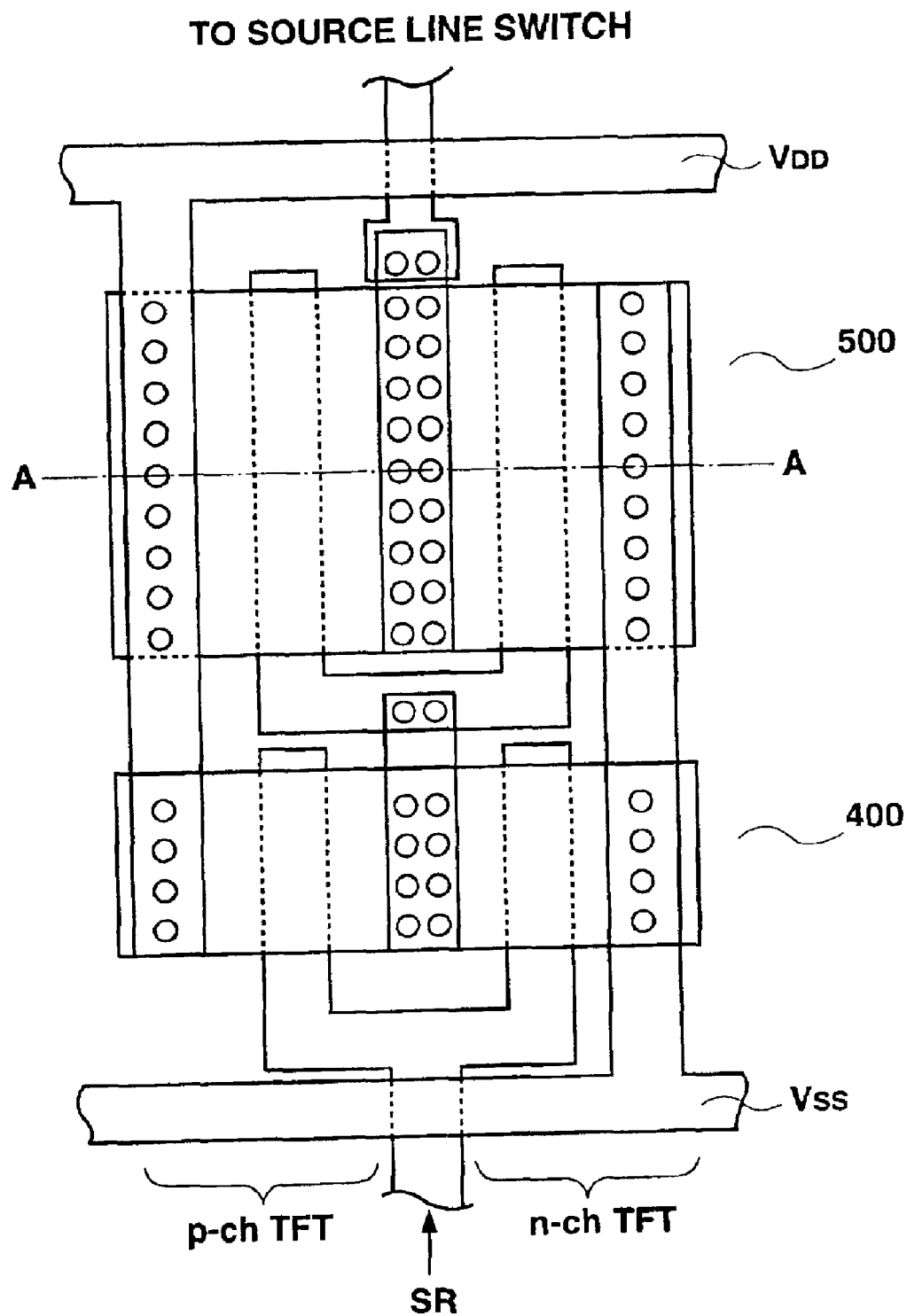
FIG. 4 is a schematic plan view of a buffer circuit among peripheral drive circuits of a related art EL display device.
Figure 10:
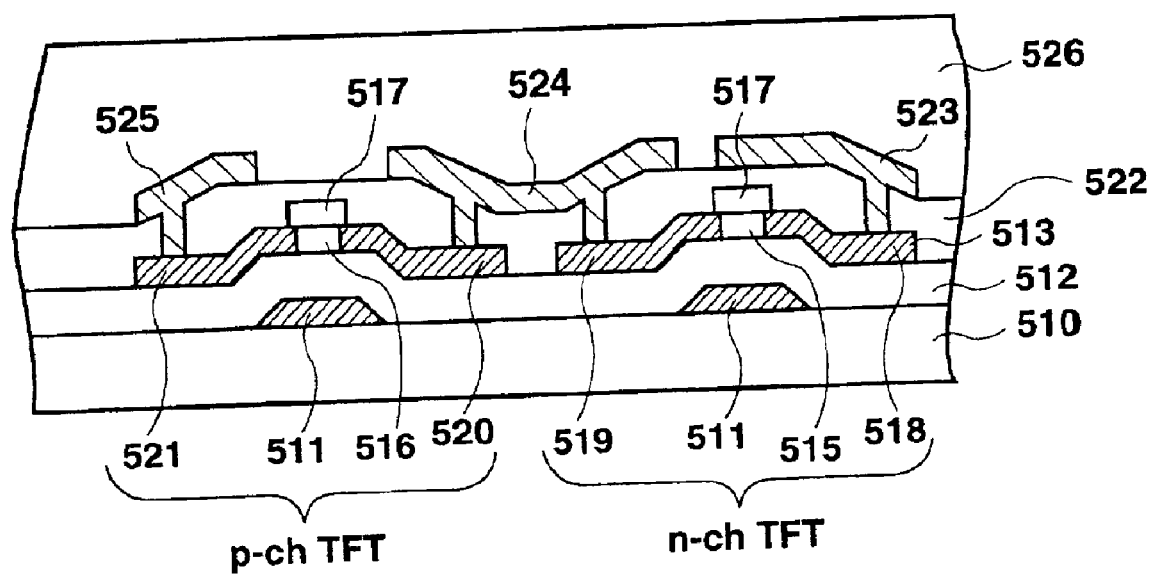
FIG. 10 is a schematic plan view of a buffer circuit among peripheral drive circuits of an EL display device according to an embodiment of the present invention.

In the following, the TFT of the buffer shown in FIG. 4 (inverter 500) is used as an example of a circuit constituting the peripheral drive circuit region 251 to explain a configuration according to the present embodiment. FIG. 10 shows the cross-sectional configuration of the inverter 500 of FIG. 4 according to the present embodiment.

Figure 5:
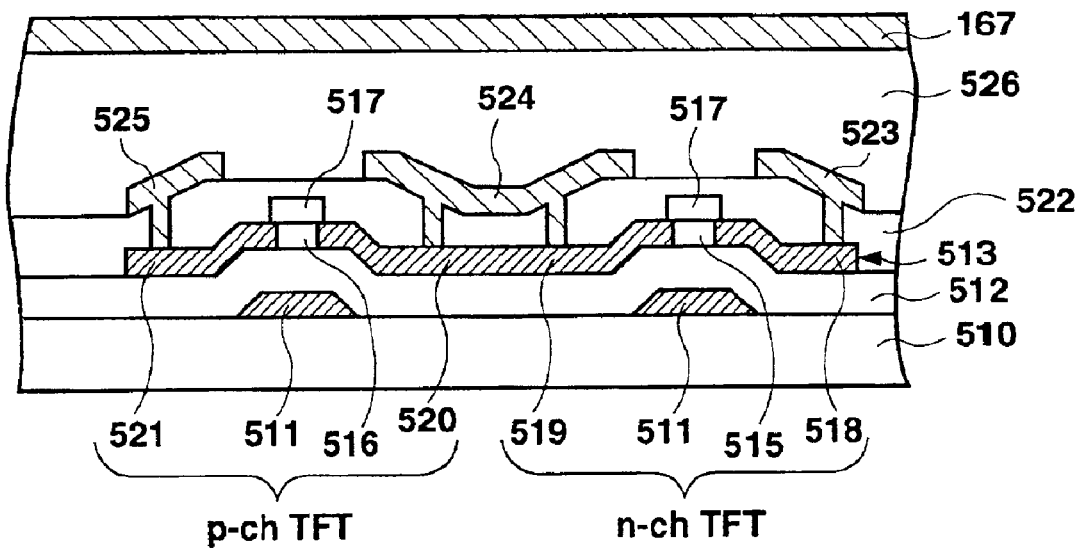
FIG. 5 shows a cross-sectional view taken along line A—A of FIG. 4.
Figure 6:
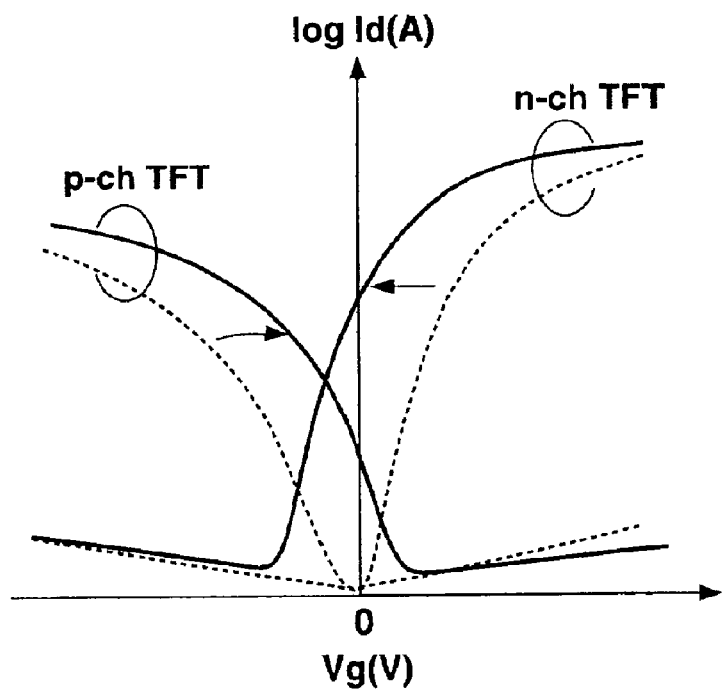
FIG. 6 is a graph showing Vg-Ig characteristics of n-type and p-type channel TFTs.

As seen in the FIG. 10, the structure of the inverter corresponds with that shown in FIG. 5 concerning the layers from the gate electrodes 511 to the planarizing insulating film formed on the insulator substrate 110.

However, differing from the structure shown in FIG. 5, the cathode 167 of the organic EL element 160 formed in the display pixel region 200 is not present over the planarizing insulating film 526.

When forming the cathode 167, a metal mask or a similar component that can cover the peripheral drive circuit region 251 excluding the display pixel region 200 is placed on the planarizing insulating film 526. Subsequently, a magnesium-indium alloy, which is the material constituting the cathode 167, is deposited on the planarizing insulating film 526 using an evaporation method. The cathode 167 can thereby be formed only in the display pixel region 200 without extending in the peripheral drive circuit region 251.

By forming the cathode 167 only in the display pixel region, characteristic changes after turning on the power can be prevented in the inverter and clocked inverter with a CMOS configuration using the n-type and p-type channel TFT employed in the peripheral drive circuit region 251.

As changes in threshold voltages of the inverters can be minimized, generation of penetration current can be suppressed, thereby preventing increase of power consumption.

Although the above embodiment was described concerning an example using the so-called bottom gate type TFT having gate electrodes disposed beneath the active layer close to the substrate, the present invention is not limited to such a structure. The present invention may be implemented using a top gate type TFT having gate electrodes disposed above the active layer, and similar effects as that of the example using a bottom gate type TFT can be achieved.

It is noted that the peripheral drive circuit region 251 is defined as a region comprising third TFT constituting vertical drive circuits 101 and horizontal drive circuit 120 for supplying signals to drive the first and second TFT 130,140 located within the display pixel region 200.

The cathode 167 of the organic EL element need only be formed in at least the display pixel region 200. The cathode 167 may also be formed, for example, in a position between the horizontal drive circuit 120 and a vertical drive circuit 101 in the plan view, as long as the cathode 167 is not formed in a region where the peripheral drive circuits are present. Preferably, the cathode 167 is formed only within the display pixel region 200 as described above.

The cathode 167 of the organic EL element may be present over the signal wiring region 24 that supplies signals to the substrate 100 on which the organic EL element is formed. However, to minimize negative influences such as generation of parasitic capacitance in signal wires, it is preferable that the cathode 167 be absent over region 24.

Further, although the above embodiment was explained using an organic EL display device as an example, the present invention is not limited to organic EL displays. Similar effects can be obtained by implementing the present invention in an inorganic EL display device which uses, as an emissive element instead of organic EL elements, inorganic EL elements comprising inorganic emissive materials. Alternatively, the present invention may be applied in a vacuum fluorescent display (VFD) having a fluorescent layer as the emissive layer between two electrodes.

Concerning the first and second TFT 130,140 formed in the display pixel region 200 and the third TFT constituting the peripheral drive circuit 251 in the above-described embodiment, corresponding structures such as gate electrodes, gate insulating films, and active layers can be formed in the same manufacturing processes. For example, the active layers of those TFT composed using poly-silicon can be formed in one process. An amorphous silicon film may be formed on the entire substrate and then polycrystallized by a method such as laser annealing. The poly-silicon film created in this way may be used as an active layer in each TFT.

What is claimed is:

1. An electroluminescence display device comprising:
    a display pixel region disposed on a substrate and having an electroluminescence element including an emissive layer between first and second electrodes; and
    a drive circuit region having a peripheral drive circuit that is integrated on said substrate, said drive circuit region having thin film transistors for driving said electroluminescence element; wherein
    said first electrode entirely overlaps said display pixel region and is absent from at least said drive circuit region, said first electrode is a common cathode, and said second electrode is a discrete anode.

2. The device defined in claim 1 wherein:
    said display pixel region includes first and second thin film transistors for driving said electroluminescence element;
    an insulating film is formed overlapping said first and second thin film transistors and said thin film transistors of said drive circuit region; and
    said first electrode is formed over said insulating film in a position opposing said display pixel region.

3. The device defined in claim 2 wherein a circuit in said drive circuit region includes a CMOS connection structure in which a p-type channel thin film transistor and a n-type channel thin film transistor are complementarily connected.

4. The device defined in claim 1 wherein:
    said thin film transistors of said drive circuit region are bottom gate type transistors having gate electrodes located beneath an active layer; and
    said first electrode is formed over an insulating layer extending on the entire substrate on an opposite side of said active layer from which said gate electrodes are located, said first electrode formed overlapping said display pixel region.

5. The device as defined in claim 1, wherein said cathode includes an end portion that extends to an area between said display pixel region and said drive circuit region.

6. An electroluminescence display device comprising a substrate provided with:
    a display pixel region having an electroluminescence element including an emissive layer between an anode and a cathode, and first and second thin film transistors for driving said electroluminescence element; and
    a drive circuit region having a peripheral drive circuit that is integrated on said substrate, said drive circuit region having third thin film transistors for driving said first and second thin film transistors; wherein
    said cathode is disposed in said display pixel region and is absent from said drive circuit region.

7. The device defined in claim 6 wherein said cathode on said substrate is formed over the entire display pixel region as a common electrode, and is absent from at least said drive circuit region.

8. The device defined in claim 6 wherein a circuit in said drive circuit region includes a CMOS connection structure in which a p-type channel thin film transistor and a n-type channel thin film transistor are complementarily connected.

9. The device defined in claim 6 wherein:
    said third thin film transistors of said drive circuit region are bottom gate type transistors having gate electrodes located beneath an active layer; and
    said cathode is formed over an insulating layer extending on the entire substrate on an opposite side of said active layer from which said gate electrodes are located, said cathode formed overlapping said display pixel region.

10. The device as defined in claim 6, wherein said cathode includes an end portion that extends to an area between said display pixel region and said drive circuit region.

11. An emissive display device comprising:
    a display pixel region disposed on a substrate and having an emissive element including an emissive layer between first and second electrodes; and
    a drive circuit region having a peripheral drive circuit that is integrated on said substrate, said drive circuit region having thin film transistors for driving said emissive element;
    wherein
    said first electrode overlaps the entire display pixel region and is absent from at least said drive circuit region, said first electrode is a common cathode, and said second electrode is a discrete anode.

12. The device as defined in claim 11, wherein said cathode includes an end portion that extends to an area between said display pixel region and said drive circuit region.

13. An electroluminescence display device comprising a substrate provided with:
    a display pixel region having an electroluminescence element including an emissive layer between an anode and a cathode, and first and second thin film transistors for driving said electroluminescence element, said cathode is formed in a layer extending above a layer in which said anode is formed; and
    a drive circuit region having a peripheral drive circuit that is integrated on said substrate, said drive circuit region having third thin film transistors for driving said first and second thin film transistors; wherein
    is disposed in said display pixel region and is absent from said drive circuit region.

14. The device as defined in claim 13, wherein said cathode includes an end portion that extends to an area between said display pixel region and said drive circuit region.

15. An electroluminescence display device comprising:
    a display pixel region disposed on a substrate and having an electroluminescence element including an emissive layer between first and second electrodes; and
    a drive circuit region having vertical and horizontal drive circuits that are located in a peripheral drive circuit region formed surrounding said display pixel region and are integrated on said substrate, said drive circuit region having thin film transistors for driving said electroluminescence element; wherein
    said first electrode entirely overlaps said display pixel region and is absent from at least said drive circuit region,
    said first electrode is a common cathode, comprises an opaque metal material, and constitutes an uppermost layer of said electroluminescence element, and said second electrode is a discrete anode.

16. The device as defined in claim 15, wherein said cathode includes an end portion that extends to an area between said display pixel region and said drive circuit region.

17. An electroluminescence display device comprising a substrate provided with:
- a display pixel region having an electroluminescence element including an emissive layer between an anode and a cathode, and first and second thin film transistors for driving said electroluminescence element; and
- a drive circuit region having vertical and horizontal drive circuits that are located in a peripheral drive circuit region formed surrounding said display pixel region and are integrated on said substrate, said drive circuit region having third thin film transistors for driving said first and second thin film transistors,
- wherein said cathode is disposed in said display pixel region and is absent from said drive circuit region,
- said cathode comprises an opaque metal material and constitutes an uppermost layer of said electroluminescence element.

18. The device as defined in claim 17, wherein said cathode includes an end portion that extends to an area between said display pixel region and said drive circuit region.

19. An emissive display device comprising:
- a display pixel region disposed on a substrate and having an emissive element including an emissive layer between first and second electrodes; and
- a drive circuit having vertical and horizontal drive circuits that are located in a peripheral drive circuit region formed surrounding said display pixel region and are integrated on said substrate, said drive circuit region having thin film transistors for driving said emissive element;
- wherein said first electrode overlaps the entire display pixel region and is absent from at least said drive circuit region, said first electrode is a common cathode, and said second electrode is a discrete anode,
- said cathode comprises an opaque metal material and constitutes an uppermost layer of said electroluminescence element.

20. The device as defined in claim 19, wherein said cathode includes an end portion that extends to an area between said display pixel region and said drive circuit region.

21. An electroluminescence display device comprising a substrate provided with:
- a display pixel region having an electroluminescence element including an emissive layer between an anode and a cathode, and first and second thin film transistors for driving said electroluminescence element, said cathode is formed in a layer extending above a layer in which said anode is formed; and
- a drive circuit region having vertical and horizontal drive circuits that are located in a peripheral drive circuit region formed surrounding said display pixel region and are integrated on said substrate, said drive circuit region having third thin film transistors for driving said first and second thin film transistors,
- wherein said cathode is disposed in said display pixel region and is absent from said drive circuit region, and
- said cathode comprises an opaque metal material and constitutes an uppermost layer of said electroluminescence element.

22. The device as defined in claim 21, wherein said cathode includes an end portion that extends to an area between said display pixel region and said drive circuit region.

23. An emissive display device comprising:
- a display pixel region disposed on a substrate and having an emissive element including an emissive layer between first and second electrodes; and
- a drive circuit region disposed on the same substrate surrounding said display pixel region, said drive circuit region having thin film transistors for driving said emissive element;
- wherein said first electrode overlaps the entire display pixel region and is absent from at least said drive circuit region, said first electrode is a common cathode, and said second electrode is a discrete anode, and
- said cathode includes an end portion that extends to an area between said display pixel region and said drive circuit region.

* * * * *

UNITED STATES PATENT AND TRADEMARK OFFICE
CERTIFICATE OF CORRECTION

PATENT NO. : 6,940,214 B1
DATED : September 6, 2005
INVENTOR(S) : Komiya et al.

It is certified that error appears in the above-identified patent and that said Letters Patent is hereby corrected as shown below:

Column 9,
Lines 14-25, delete and substitute the following:

-- 1. An electroluminescence display device comprising:
    a display pixel region disposed on a substrate and comprising an electroluminescence element having, between first and second electrodes, an emissive layer including an organic compound; and
    a peripheral drive circuit disposed on said substrate, for controlling said electroluminescence element located in said display pixel region, said peripheral drive circuit being integrated in a peripheral region on an outside of said display pixel region and between said display pixel region and edges of said substrate, said peripheral drive circuit having a plurality of thin film transistors; wherein
        said second electrode of said electroluminescence element is a discrete anode;
        said emissive layer is formed overlapping said second electrode;
        said first electrode is formed overlapping said emissive layer as a common electrode for said display pixel region, said first electrode disposed overlapping said display pixel region, terminating in a substrate region on an inside with respect to said peripheral region, and being absent from said peripheral region. --.

Lines 32, 36 and 40, before "drive", insert -- peripheral --.
Lines 32, 36 and 40, after "circuit", delete "region".
Line 35, after "wherein", delete "a circuit in".
Line 51, before "region", delete "drive circuit" and insert -- peripheral --.
Lines 52-63, delete and substitute the following:

-- 6. An electroluminescence display device comprising a substrate provided with:
    a display pixel region having an electroluminescence element including an emissive layer between an anode and a cathode, and first and second thin film transistors for driving said electroluminescence element, said emissive layer includes an organic compound; and
    a peripheral drive circuit integrated on said substrate in a peripheral region on an outside of said display pixel region and between said display pixel region and edges of said substrate, said peripheral drive circuit having third thin film transistors for driving said first and second thin film transistors; wherein
        said anode is formed overlapping said emissive layer,
        said cathode overlaps said display pixel region, terminates in a substrate region on an inside of said peripheral region, and is absent from said peripheral region. --.

Line 65, after "electrode", delete ", and is absent from at least said drive".
Line 66, delete "circuit region".

Column 10,
Lines 2 and 6, before "drive", insert -- peripheral --.
Lines 2 and 6, after "circuit", delete "region".
Line 11, after "located", delete ", said".

UNITED STATES PATENT AND TRADEMARK OFFICE
CERTIFICATE OF CORRECTION

PATENT NO. : 6,940,214 B1
DATED : September 6, 2005
INVENTOR(S) : Komiya et al.

It is certified that error appears in the above-identified patent and that said Letters Patent is hereby corrected as shown below:

<u>Column 10 (cont'd),</u>
Line 12, delete "cathode formed overlapping said display pixel region".
Line 15, before "region", delete "drive circuit" and insert -- peripheral --.
Lines 16-28, delete and substitute the following:

-- 11. An emissive display device comprising:
a display pixel region disposed on a substrate and having an emissive element including an emissive layer between first and second electrodes, said emissive layer includes an organic compound; and
a peripheral drive circuit integrated on said substrate in a peripheral region on an outside of said display pixel region and between said display pixel region and edges of said substrate, said peripheral drive circuit having thin film transistors for driving said emissive element;
wherein said first electrode overlaps said display pixel region, terminates in a substrate region on an inside of said peripheral region, and is absent from said peripheral region, said first electrode is a common cathode, and said second electrode is formed overlapping said emissive layer, said second electrode is a discrete anode. --.

Line 31, after "said", delete "drive circuit" and insert -- peripheral --.
Lines 33-46, delete and substitute the following:

-- 13. An electroluminescence display device comprising a substrate provided with:
a display pixel region having an electroluminescence element including an emissive layer between an anode and a cathode, and first and second thin film transistors for driving said electroluminescence element, said cathode is formed in a layer extending above a layer in which said anode is formed, said emissive layer includes an organic compound; and
a peripheral drive circuit integrated on said substrate in a peripheral region on an outside of said display pixel region and between said display pixel region and edges of said substrate, said peripheral drive circuit having third thin film transistors for driving said first and second thin film transistors; wherein
said anode is formed overlapping said emissive layer,
said cathode overlaps said display pixel region, terminates in a substrate region on an inside of said peripheral region, and is absent from said peripheral region. --.

Line 49, after "said", delete "drive circuit" and insert -- peripheral --.

<u>Column 10, line 51 through Column 11, line 1,</u>
Delete and substitute the following:

-- 15. An electroluminescence display device comprising:
a display pixel region disposed on a substrate and having an electroluminescence element including an emissive layer between first and second electrodes, said emissive layer includes an organic compound; and
a peripheral drive circuit region integrated on said substrate in a peripheral region on an outside of said display pixel region and between said display pixel region and edges of said substrate, said peripheral drive circuit region having vertical and horizontal drive circuits, said peripheral drive circuit region having thin film transistors for driving said electroluminescence element; wherein

UNITED STATES PATENT AND TRADEMARK OFFICE
CERTIFICATE OF CORRECTION

PATENT NO. : 6,940,214 B1
DATED : September 6, 2005
INVENTOR(S) : Komiya et al.

It is certified that error appears in the above-identified patent and that said Letters Patent is hereby corrected as shown below:

<u>Column 10, line 51 through Column 11, line 1 (cont'd),</u> said first electrode overlaps said display pixel region, terminates in a substrate region on an inside of said peripheral drive circuit region, and is absent from said peripheral drive circuit region,
said first electrode is a common cathode, comprises an opaque metal material, and constitutes an uppermost layer of said electroluminescence element, and
said second electrode is formed overlapping said emissive layer, said second electrode is a discrete anode. --.

<u>Column 11,</u>
Line 4, before "drive" insert -- peripheral --.
Lines 6-23, delete and substitute the following:

-- 17. An electroluminescence display device comprising a substrate provided with:
a display pixel region having an electroluminescence element including an emissive layer between an anode and a cathode, and first and second thin film transistors for driving said electroluminescence element, said emissive layer includes an organic compound; and
a peripheral drive circuit region integrated on said substrate in a peripheral region on an outside of said display pixel region and between said display pixel region and edges of said substrate, said peripheral drive circuit region having vertical and horizontal drive circuits, said peripheral drive circuit region having third thin film transistors for driving said first and second thin film transistors,
wherein said anode is formed overlapping said emissive layer,
said cathode overlaps said display pixel region, terminates in a substrate region on an inside of said peripheral drive circuit region, and is absent from said peripheral drive circuit region,
said cathode comprises an opaque metal material and constitutes an uppermost layer of said electroluminescence element. --.

Line 26, before "drive" insert -- peripheral --.
Lines 28-43, delete and substitute the following:
-- 19. An emissive display device comprising:
a display pixel region disposed on a substrate and having an emissive element including an emissive layer between first and second electrodes, said emissive layer includes an organic compound; and
a peripheral drive circuit integrated on said substrate in a peripheral region on an outside of said display pixel region and between said display pixel region and edges of said substrate, said peripheral drive circuit having vertical and horizontal drive circuits, said peripheral drive circuit having thin film transistors for driving said emissive element;
wherein said first electrode overlaps said display pixel region, terminates in a substrate region on an inside of said peripheral region, and is absent from said peripheral region, said first electrode is a common cathode, and said second electrode is formed overlapping said emissive layer, said second electrode is a discrete anode,
said cathode comprises an opaque metal material and constitutes an uppermost layer of said electroluminescence element. --.

UNITED STATES PATENT AND TRADEMARK OFFICE
CERTIFICATE OF CORRECTION

PATENT NO.    : 6,940,214 B1
DATED         : September 6, 2005
INVENTOR(S)   : Komiya et al.

It is certified that error appears in the above-identified patent and that said Letters Patent is hereby corrected as shown below:

Column 12,
Line 3, after "said", delete "drive circuit" and insert -- peripheral --.
Lines 5-23, delete and substitute the following:

-- 21. An electroluminescence display device comprising a substrate provided with:
  a display pixel region having an electroluminescence element including an emissive layer between an anode and a cathode, and first and second thin film transistors for driving said electroluminescence element, said emissive layer includes an organic compound, said cathode is formed in a layer extending above a layer in which said anode is formed; and
  a peripheral drive circuit region integrated on said substrate in a peripheral region on an outside of said display pixel region and between said display pixel region and edges of said substrate, said peripheral drive circuit region having vertical and horizontal drive circuits, said peripheral drive circuit region having third thin film transistors for driving said first and second thin film transistors,
  wherein said anode is formed overlapping said emissive layer,
  said cathode overlaps said display pixel region, terminates in a substrate region on an inside of said peripheral drive circuit region, and is absent from said peripheral drive circuit region, and
  said cathode comprises an opaque metal material and constitutes an uppermost layer of said electroluminescence element. --.

Line 26, before "drive" insert -- peripheral --.
Lines 28-42, delete and substitute the following:

-- 23. An emissive display device comprising:
  a display pixel region disposed on a substrate and having an emissive element including an emissive layer between first and second electrodes, said emissive layer includes an organic compound; and
  a peripheral drive circuit region disposed on said substrate and is formed in a region around said display pixel region and between said display pixel region and edges of said substrate, said peripheral drive circuit region having thin film transistors for driving said emissive element;
  wherein said first electrode overlaps the entire display pixel region, terminates in a substrate region on an inside of said peripheral drive circuit region, and is absent from at least said peripheral drive circuit region, said first electrode is a common cathode, and said second electrode is a discrete anode, and

UNITED STATES PATENT AND TRADEMARK OFFICE
CERTIFICATE OF CORRECTION

PATENT NO. : 6,940,214 B1
DATED : September 6, 2005
INVENTOR(S) : Komiya et al.

It is certified that error appears in the above-identified patent and that said Letters Patent is hereby corrected as shown below:

Column 12 (cont'd), said cathode includes an end portion that extends to an area between said display pixel region and said peripheral drive circuit region. --.

Signed and Sealed this

Thirteenth Day of June, 2006

JON W. DUDAS
*Director of the United States Patent and Trademark Office*